United States Patent [19]

Tan

[11] Patent Number: 4,719,366
[45] Date of Patent: Jan. 12, 1988

[54] OUTPUT STATE PROTECTION NETWORK FOR D-TYPE FLIP-FLOP

[75] Inventor: Sherman M. Tan, San Francisco, Calif.

[73] Assignee: Advanced Micro Devices, Inc., Sunnyvale, Calif.

[21] Appl. No.: 786,885

[22] Filed: Oct. 11, 1985

[51] Int. Cl.$^4$ .................... H03K 3/289; H03K 3/29
[52] U.S. Cl. .................... 307/272.2; 307/200 A; 307/458; 307/542; 307/546; 307/443
[58] Field of Search ............ 307/200 A, 443, 272 A, 307/458, 542, 546, 557, 558

[56] References Cited

U.S. PATENT DOCUMENTS 4,517,475  5/1985  Petty .................... 307/222 A

FOREIGN PATENT DOCUMENTS 0230714  11/1985  Japan .................... 307/272 A

OTHER PUBLICATIONS

Eardley, "Latch Circuit Insensitive to Disturbance by Alpha Particles," IBM Tech. Disclosure, vol. 24, No. 12, May 1982, pp. 6461–6462.

Primary Examiner—Stanley D. Miller
Assistant Examiner—Timothy P. Callahan
Attorney, Agent, or Firm—Patrick T. King; Davis Chin; J. Vincent Tortolano

[57] ABSTRACT

A D-type master-slave flip-flop includes a master section, a slave section and an output state protection network. The master section has a data input node and a clock input node. The slave section has at least one data output node connected to an output terminal. The output state protection network is responsive to the master section for toggling the slave section so that the data output node is returned to its initial logic state when the output terminal is free of transient noise.

8 Claims, 2 Drawing Figures

OUTPUT STATE PROTECTION NETWORK FOR D-TYPE FLIP-FLOP

BACKGROUND OF THE INVENTION

This invention relates generally to logic circuits of the type fabricated on a monolithic silicon semiconductor chip of an integrated circuit and more particularly, it relates to an output state protection network for a D-type master-slave flip-flop.

As it is well known, one form of flip-flop useful in digital logic applications is a D-type master-slave flip-flop which is sometimes referred to as an edge-triggered D-type flip-flop. Such a flip-flop has a single data input (D input), either one or a pair of complementary data outputs (Q or $\overline{Q}$ or both), and a clock input (CLK). In operation, data in the form of a logic level present at the data input (D input) is transferred to the data output (Q output) when the clock input CLK makes a specified clock pulse edge or transition (i.e. transition from logic "low" or "0" level to logic "high" or "1" level). If provided, complementary data output is available at the $\overline{Q}$ output. When the clock input CLK level changes from the high state to the low state, the logic state present at the D input prior to the clock transition is retained or latched at data output or outputs, regardless of subsequent changes in the data input until such time the clock input CLK makes a low-to-high transition again.

Such a typical prior art TTL D-type master-slave flip-flop is illustrated in FIG. 1 of the drawings and has been labeled "Prior Art". This flip-flop 10 is commercially available in integrated circuit form from Intel Corporation under a part No. designation of 88284. Typically, such a flip-flop may be included as but a small part of a much larger integrated circuit (i.e., large scale integration) in combination with either a variety of other types of digital logic elements and circuits or in combination with plurality of other similar D-type flip-flops.

As implied by the name of such a flip-flop, it is formed of two sections which are referred to in the art as a "master" section 12 and "slave" section 14. As can be seen, the data output Q is coupled by diode D801 to the base of a transistor Q804 and the complementary data output $\overline{Q}$ is coupled by diode D803 to the base of a transistor Q814 to form a toggle network so as to maintain the respective data outputs Q and $\overline{Q}$ in a stable state. For instance, when the data output Q is in a low state, the complementary data output $\overline{Q}$ will be forced to a high state through the diode D803. Accordingly, the data outputs Q and $\overline{Q}$ will remain in the same condition once the clock input CLK has been released. However, this toggle network arrangement suffers from a defect in that when a transient noise occurs at the data output which is in the high state this causes the high output to be pulled low. As a result, the other data output which is initially low will be forced to a high state because of the transient noise. Consequently, the flip-flop 10 will have its respective data outputs changed without any data input.

It would therefore be desirable to provide an output state protection network for toggling the data output node of a D-type master-slave flip-flop so the output node will be returned to its initial state after any transient noise has been removed from its output. As a result, the original data output has been protected from change in its state due to the transient noise.

SUMMARY OF THE INVENTION

Accordingly, it is a general object of the present invention to provide a D-type master-slave flip-flop having an output state protection network which is relatively simple and economical to manufacture and assemble, but yet overcomes the defect of the prior art flip-flop.

It is an object of the present invention to provide an output state protection network for a D-type master-slave flip-flop which protects the data output node from changing state when the output is being pulled low.

It is another object of the present invention to provide an output state protection network for toggling the data output of a D-type master-slave flip-flop so the output will return to its initial state after any transient noise as been removed.

It is still another object of the present invention to provide an output state protection network interconnected between the master section and the slave section of the a D-type flip-flop for toggling the data output node to its initial logic state after the occurrence of a transient noise.

It is yet still another object of the present invention to provide an output state protection network for a D-type master-slave flip-flop which consists of four transistors, a diode and three resistors.

In accordance with these aims and objectives, the present invention is concerned with the provision of a D-type master-slave flip-flop which includes a master section, a slave section and an output state protection network. The master section has a data input node, a clock input node, a true master data output node, a complementary master data output node and a collector master data output node. The slave section is formed of a true output buffer portion and a complementary output buffer portion. The true output buffer portion has a first data input node, a second data input node, and a true data output node. The complementary output buffer portion has a first data input node, a second data input node, and a complementary data output node. The true output buffer portion has its first data input connected to the complementary master data output node and its true data output node connected to the second data input node of the complementary output buffer portion. The complementary output buffer portion has its first data input node connected to the true master data output node and its complementary data output node connected to an output terminal. The protection network has a first data input node, a second data input node, and an output node for toggling the complementary output buffer portion so that the complementary data output node is returned to its initial logic state when the output terminal is free of transient noise. The protection network has its first data input node connected to the collector master data output node, its second input node connected to the true data output node of the true output buffer portion, and its output node connected to the second data input node of the true output buffer portion.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description, taken in junction with the accompanying drawings, wherein:

DESCRIPTION OF THE PREFERRED EMBODIMENTS

Figure 1:
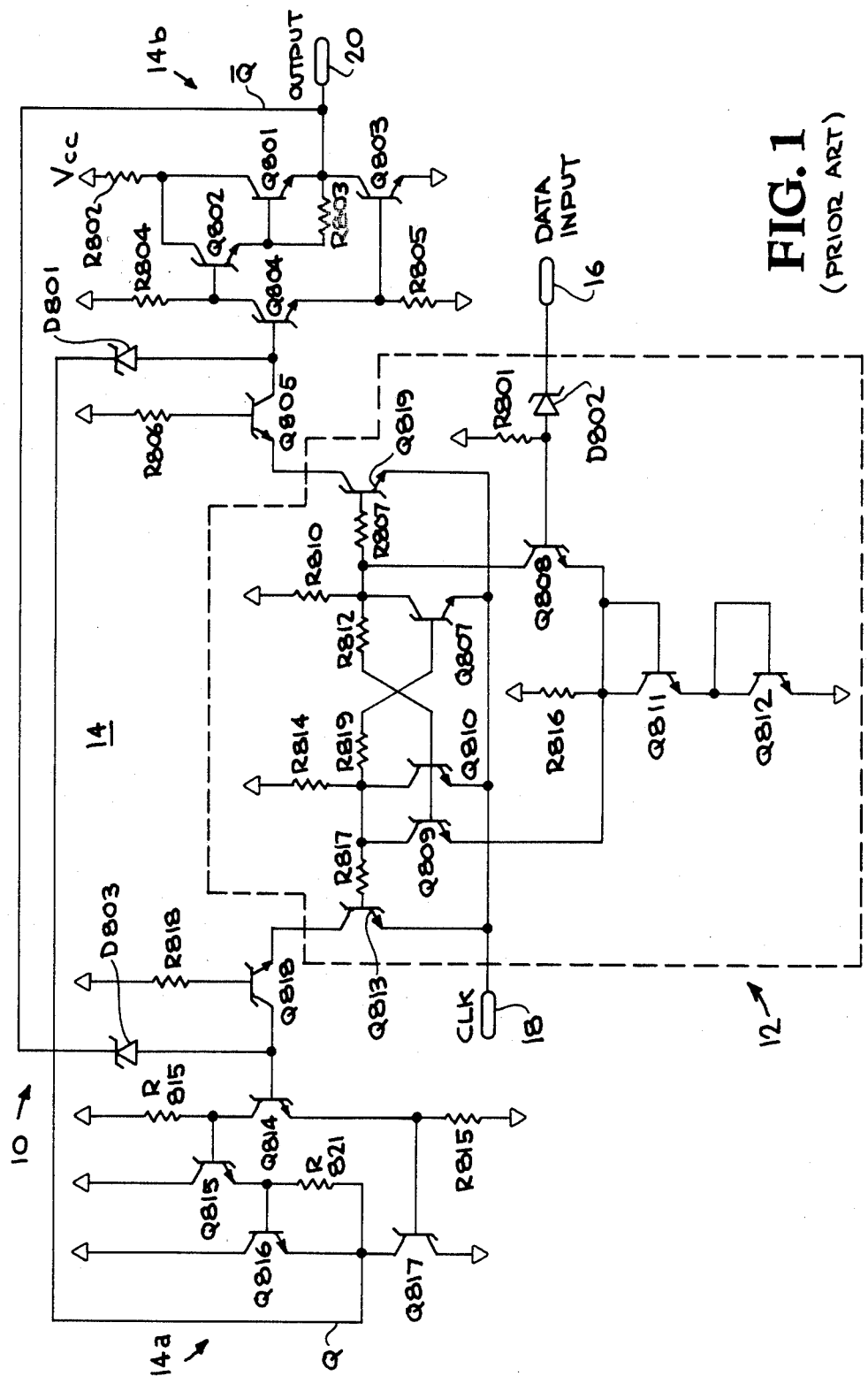
FIG. 1 is a schematic circuit diagram of a prior art D-type master-slave flip-flop including a master section and a slave section.

Referring now in detail to the drawings, there is illustrated in FIG. 1 a schematic circuit diagram of a prior art TTL edge-triggered D-type static flip-flop 10 having a master section 12 and a slave section 14. The D-type flip-flop 10 has a data input terminal 16 for receiving a data input D, a clock input terminal 18 for receiving a clock input CLK and a data output terminal 20 for generating a complementary data output $\bar{Q}$. For ease of illustration, it will be noted that the true data output Q has not been connected to an output terminal.

The data input D at the terminal 16 is provided through a diode D802 to the base of a transistor Q808. The clock input CLK at the terminal 18 is provided to the emitters of transistors Q807, Q809, Q813, and Q819. The base of the transistor Q808 is tied via a resistor R801 to a supply voltage or potential VCC which is typically +5.0 volts. The collector of the transistor Q808 is tied to the supply potential VCC via a resistor R810, to the base of the transistor Q819 via a resistor R807 and to the base of the transistor Q810 via a resistor R812. The emitter of the transistor Q808 is connected to the supply potential VCC via a resistor R816, to the emitter of transistor Q809 and to the collector of a transistor Q811. The base and collector of the transistor Q811 are tied together functioning as a diode. The base and collector of a transistor Q812 are tied together functioning as a diode and to the emitter of the transistor Q811. The emitter of the transistor Q812 is connected to a ground potential. The base of the transistor Q807 is connected to collectors of the transistors 2809 and Q810 via a resistor R819. The emitter of the transistor Q807 is connected to the emitter of the transistor Q819. The bases and collectors of the transistors Q809 and Q810 are joined together, respectively. The common collectors of transistors Q809 and Q810 are connected to the supply potential VCC via a resistor R814 and to the base of the transistor Q813 via a resistor R817.

Thus far, there has been described in the circuit components which form the master section 12. The collector of the transistor Q813 defines a complementary master data output node. The collector of the transistor Q819 defines a true master data output node. The slave section 14 consists of a true output buffer portion 14a and a complementary output buffer portion 14b.

The collector of the transistor Q813 is connected to the emitter of a transistor Q818 which defines a first input data node of the true output buffer portion 14a. The base of the transistor Q818 is tied to the supply potential VCC via a resistor R818. The collector of the transistor Q818 is connected to the base of a transistor Q814 and to the complementary data output node ($\bar{Q}$) at the collector of the transistor Q803 via a diode D803. The base of the transistor Q814 is defined to be a second data input node of the true output buffer portion 14a. The collector of the transistors Q814 is connected to the supply potential VCC via a resistor R815 and to the base of a transistor Q815. The emitter of the transistor Q814 is joined to the base of a transistor Q817 and to the ground potential via a resistor R819. The collector of the transistor Q815 is tied to the supply potential VCC. The emitter of the transistor Q815 is connected to the base of a transistor Q816 and to one end of a resistor R821. The collector of the transistor Q816 is also tied to the supply potential VCC. The emitter of the transistor Q816 is connected to the other end of the resistor R821 and to the collector of the transistor Q817. The collector of the transistor Q817 defining a true data output node (Q) is connected to the base of a transistor Q804 via a diode D801. The emitter of the transistor Q817 is tied to the ground potential.

The collector of the transistor Q819 is connected to the emitter of a transistor 2805 defining a first data input node of the complementary output buffer portion 14b. The base of the transistor 2805 is joined to the supply potential VCC via a resistor R806. The collector of the transistor 2805 is connected to the base of a transistor Q804 which is defined as a second input data node of the complementary output buffer portion 14b. The collector of the transistor Q804 is tied to the supply potential VCC via a resistor R804 and to the base of a transistor Q802. The emitter of the transistor Q804 is connected to the base of a transistor Q803 and to the ground potential via a resistor R805. The collector of the transistor Q802 is also tied to the supply potential VCC via a resistor R802 and to the collector of a transistor Q801. The emitter of the transistor Q802 is connected to the base of the transistor Q801 and to one end of a resistor R803. The emitter of the transistor Q801 is connected to the collector of the transistor Q803 defining the complementary data output node ($\bar{Q}$) and to the other end of the resistor R803. The emitter of the transistor Q803 is connected to the ground potential.

In operation, with the clock input CLK at the terminal 18 being in the high state, it is assumed that a data input D is applied to the terminal 16 which is of a low logic level. This causes the current flowing in the resistor R801 to pass through the diode D802, thereby turning off the transistor Q808. Thus, the collector of the transistor Q808 will be in a high state which will cause the turning on of the transistor Q819. This will, in turn, cause the transistor Q809 to be turned on. In addition, since the collector of the transistor Q808 is in the high state this also causes the turning on of the transistor Q810 and the turning off of the transistor Q807. Consequently, the transistors Q813 and Q818 are turned off. Therefore, the potential at the base of the transistor Q814 will be in a high state. This causes the turning on of the transistors Q814 and Q817 and the turning off of the transistors Q815 and Q816. Since the transistor Q817 is turned on, the diode D801 will also be rendered conductive. As a result, the transistors Q804 and Q803 are both rendered to be non-conductive, and the transistor Q802 and Q801 are both rendered to be conductive. Therefore, the complementary data output node ($\bar{Q}$ at the collector of the transistor Q803 and at the output terminal 20 will be in a high logic state.

As can be seen, with the high logic state at the complementary data output node ($\bar{Q}$) the diode D803 is rendered non-conductive. This serves to maintain the transistors Q814 and Q817 turned on and the transistor Q815 and Q816 to be turned off. Therefore, the true data output node ($\bar{Q}$) at the collector of the transistor Q817 will indeed be in the low logic level. This low logic level at the collector of the transistor Q817 will be fed back to the base of the transistor Q804 via the diode D801 so as to maintain the transistors Q804 and Q803 to be turned off. As a result, the complementary data output node ($\overline{Q}$) will stay in the high logic level. When the clock is released or changed to a low logic state, the complementary data output node ($\overline{Q}$) will be latched in the high state and the true data output node (Q) will be latched in the low state. Therefore, a stable condition has been obtained at the respective data output nodes.

Now, assuming a transient noise occurs at the complementary data output node ($\overline{Q}$) which is in the high state so as to cause the high output to be pulled low. It can be seen that the low level will cause the diode D803 to be rendered conductive which will, in turn, cause the turning off of the transistors Q814 and Q817 and cause the turning on of the transistors Q815 and Q816. Therefore, the true data output node (Q) at the collector of the transistor Q817, which was initially low, will be changed to a high state. This high state at the true data output (Q) will render the diode D801 to be non-conductive. Further, the conduction of the diode D803 will cause the transistors Q818 and Q813 to turn off and the transistor Q807 to be turned on. This will, in turn, cause the turning off of transistor Q819. As a result, the transistor Q809 will be turned off which renders the base of the transistor Q804 to be in a high state. Thus, the transistors Q804 and Q803 will be turned on and the transistors Q802 and Q801 will be turned off. Consequently, the complementary data output node ($\overline{Q}$) will be changed to a low state without any data input being applied to the terminal 16, thereby causing an undesired condition.

Figure 2:
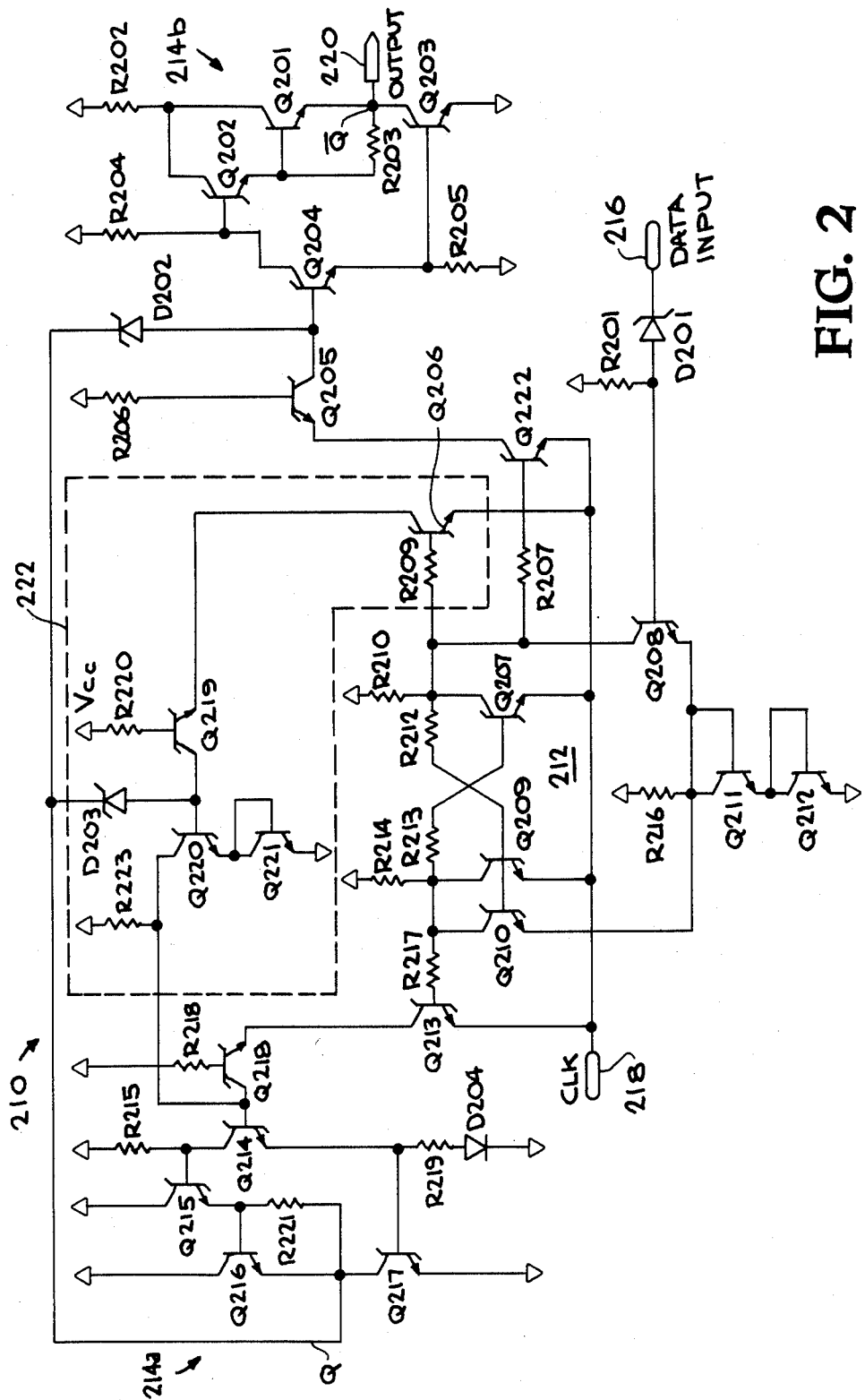
FIG. 2 is a schematic circuit diagram of an output state protection network of the present invention for use in connection with the D-type flip-flop of FIG. 1.

The present invention is concerned with the prevention of the changing of the high output state in the D-type flip-flop to a low state upon the occurrence of a transient noise. This accomplished in the present invention via the provision of an output state protection network which is connected to the D-type flip-flop of FIG. 1. In FIG. 2 of the drawings, there is illustrated a schematic circuit diagram of an output state protection network 222 for use with the D-type flip-flop 210 of FIG. 1.

The output state protection network 222 includes a first transistor Q206, a second transistor Q219, a third transistor Q220, a fourth transistor Q221, a diode D203, a first resistor R209, a second resistor R220 and a third resistor R223. It can be seen, by comparing FIGS. 1 and 2, that the connection of the diode D803 in FIG. 1 between the complementary data output node ($\overline{Q}$) at the collector of the transistor Q803 and the base of the transistor Q814 has been eliminated in FIG. 2. In lieu thereof, the collector of the transistor Q207 is connected to the resistor R209, the cathode of the diode D203 is connected to the collector of the transistor Q217 and the collector of the transistor Q220 is connected to the base of the transistor Q214. Except for these changes, the components and connections of the D-type flip-flop 210 of FIG. 2 are identical to that previously described with respect to FIG. 1. It will be noted that the reference numerals in FIG. 2 begin with a two hundred number rather than the eight hundred number in FIG. 1. Accordingly, the details of the D-type flip-flop 210 of FIG. 2 will not be repeated and only the components and connections of the output state protection network 222 will now be described.

One end of the first resistor R209 defining a first input data node of the protection network 222 is connected to the collector of the transistor 2207 which forms a collector data output node of the master section 12. The other end of the first resistor R209 is connected to the base of the first transistor Q206. The emitter of the first transistor Q206 is connected to the common emitters of the transistors Q207, Q209, and Q213 which receive the clock input CLK at terminal 218. The collector of the first transistor Q206 is joined to the emitter of the second transistor Q219. The base of the second transistor Q219 is joined to the supply potential VCC via the second resistor R220. The collector of the second transistor Q219 is connected to the anode of the diode D203 and to the base of the third transistor Q220. The cathode of the didoe D203 defining a second data input node of the protection network 222 is tied to the cathode of the diode D202 and to the true data output node (Q) at the collector of the transistor Q217. The emitter of the third transistor Q220 is tied to the collector and base of the fourth transistor Q221 connected as a diode. The emitter of the fourth transistor Q221 is tied to the ground potential. The collector of the third transistor Q220 defining the output node of the protection network is connected to the supply potential VCC via the third resistor R223 and to the base of the transistor Q214 which forms the second data input node of the true output buffer portion 214a.

The operation of the protection network 222 in connection with the D-type flip-flop 210 of FIG. 2 will now be described. With the clock input CLK at the terminal 218 being in the high logic state, it is again assumed that a data input D is applied to the terminal 216 which is of a low logic level. The D-type flip-flop 210 will function in the same manner as discussed before so as to cause the transistors Q201 and Q202 to be turned on and the transistors Q203 and Q204 to be turned off. As as result, the complementary data output node ($\overline{Q}$) at the output terminal 220 in the complementary output buffer portion 214b will be in the high logic state and the true data output node (Q) at the collector of the transistor Q217 in the true output buffer 214a will be in the low logic state. Further, the collector data output node of the master section 212 at the collector of the transistor Q207 will be in the high output state. Since this high output state is fed to the first input node of the protection network 222, this will cause the first transistor Q206 to be turned on. This will, in turn, turn on the second transistor Q219. Since the collector of the transistor Q217 is in the low state, the diode D203 will be rendered conductive. As a result, the third transistor Q220 will be rendered non-conductive so that its collector will be in the high logic state. Consequently, the transistor Q214 and Q217 are both maintained in the "on" condition and the transistors Q215 and Q216 are both maintained in the "off" condition, thereby causing the true data output node (Q) to be in the low logic level.

Once the clock input CLK is changed to a low logic level, complementary data output node ($\overline{Q}$) will be latched in the high logic level and the true data output node (Q) will be latched in the level. Further, the output node of the protection network 22 at the collector of the transistor Q220 will be latched in the high logic level.

Now, assume that a transient noise occurs at the output terminal 220 which pulls the complementary data output node ($\overline{Q}$) to a low logic state. This will have the effect of turning off of the transistors Q201 and Q202 and turning on of the transistors Q203 and Q204. However, since the complementary data output node ($\overline{Q}$) is no longer fed back to the true output buffer portion 214a as was done in FIG. 1, there is no effect on the true data output node (Q) at the collector of the transistor Q217. Since the output of the protection network 222 is latched at a high logic level at the base of the transistor Q214, this serves to maintain the true data output node (Q) in a low logic level. As soon as the transient noise disappears, the true data output node (Q) toggles through the diode D202 to the base of the transistor Q204. Consequently, this will turn off the transistors Q204 and Q203 and will cause the transistors Q202 and Q201 to be turned on, thereby returning the complementary data output node ($\overline{Q}$) to its initial high state While the protection network of the present invention has been shown in connection with protecting the complementary data output node ($\overline{Q}$) when the output terminal is pulled low, it should be apparent to those skilled in the art that the protection network could be connected so as to protect the true data output node (Q). In addition, two such protection networks may be used so as to protect both the true and complementary data outputs Q and $\overline{Q}$, respectively. It is envisioned that the protection network and the D-type master-slave flip-flop are formed on a single semiconductor chip of an integrated circuit. It is preferable that all of the transistor elements in the protection network as well as the ones in the flip-flop circuit be Schottky transistors, thereby avoiding saturation and increasing the switching speed. It is also desirable that all of the diodes be formed as Schottky-barrier diodes.

In order to protect the true data output node (Q) when it is connected as the output terminal, it should be clearly understood that the connections of the protection network 222 shown in FIG. 2 could be simply modified by those skilled in the art. In particular, the first input data node of the protection network 222 at the resistor R209 would be connected to the collector of the transistor Q209 rather than the collector of the transistor Q207. While the collector of the transistor Q207 forms the collector data output node which is associated with the true master data output node at the collector of the transistor Q222, the collector of the transistor Q209 forms a collector data output node which is associated with the complementary master data output node at the collector of the transistor Q213. While the cathode of the diode D203 defining the second input data node of the protection network would remain connected to the cathode of the diode D202, the cathode of the diode D203 would be connected to the complementary data output node ($\overline{Q}$) at the collector of the transistor Q203 rather than to the collector of the transistor Q217. The anode of the diode D202 would be connected to the base of the transistor Q214 rather than to the base of the transistor Q204. Finally, the output node of the protection network at the collector of the transistor Q220 would be connected to the base of the transistor Q204 rather than to the base of the transistor Q214.

From the foregoing detailed description, it can thus be seen that the present invention provides an output state protection network for a D-type master-slave flip-flop in which the data output is protected from changing state when it is pulled low due to transient noise. The protection network of the present invention is used to toggle an output buffer portion so that the data output is returned to its initial logic state after the occurrence of the transistor noise.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A D-type master-slave flip-flop including an output terminal comprising:
    a master section having a data input node, a clock input node, a true master data output node, a complementary master data output node, and a collector master data output node associated with said true master data output node ;
    a slave section being formed of a true output buffer portion and a complementary output buffer portion;
    said true output buffer portion having a first data input node, a second data input node and a true data output node;
    said complementary output buffer portion having a first data input node, a second data input node and a complementary data output node;
    said true output buffer portion having its first data input node being connected to the complementary master data output node and having its true data output node being connected to the second data input node of said complementary output buffer portion;
    said complementary output buffer portion having its first data input node being connected to the true master data output node and its complementary data output node connected to the output terminal;
    protection network means having a first data input node, a second data input node, and an output node for preventing a change in logic state at the complementary data output node when it is initially in a high logic state and is pulled to a low logic state due to transient noise, said protection network means toggling said complementary output buffer portion so that the complementary data output node is returned to its initial logic state when the output terminal is free of the transient noise; and
    said protection network having its first input node connected to the collector master data output node, its second input node connected to the true data output node of said true output buffer portion and its output node connected to the second input node of said true output buffer portion.

2. A flip-flop as claimed in claim 1, wherein said protection network means comprises a first resistor having its one end defining the first data input node thereof and being connected to the collector master data output node, the other end of said first resistor being connected to the base of first transistor, said first transistor having its emitter connected to a ground potential and its collector connected to the emitter of a second transistor, said second transistor having its base connected to a supply potential via a second resistor and having its collector connected to the anode of a diode and to the base of a third transistor, the cathode of said diode defining the second data input node thereof and being connected to the true data output node of said true output buffer portion, said third transistor having its emitter connected to the base and collector of a fourth transistor, the emitter of said fourth transistor being connected to a ground potential, said third transistor having its collector defining the output node thereof and being connected to the supply potential via a third resistor and to the second data input node of said true output buffer portion.

3. A flip-flop as claimed in claim 2, wherein said diode is a Schottky-barrier diode.

4. A flip-flop as claimed in claim 2, wherein said first through fourth transistors are Schottky transistors.

5. A D-type master-slave flip-flop including an output terminal comprising:

a master section having a data input node, a clock input node, a true master data output node, a complementary master data output node, and a collector master data output node associated with said complementary master data output node;

a slave section being formed of a true output buffer portion and a complementary output buffer portion;

said true output buffer portion having a first data input node, a second data input node and a true data output node;

said complementary output buffer portion having a first data input node, a second data input node and a complementary data output node.

said complementary output buffer portion having its first data input node being connected to the true master data output node and having its complementary data output node being connected to the second data input node of said true output buffer portion;

said true output buffer portion having its first data input node being connected to the complementary master data output node and its true data output node connected to the output terminal;

protection network means having a first data input node, a second data input node, and an output node for preventing a change in logic state at the true data output node when it is initially in a high logic state and is pulled to a low logic state due to transient noise, said protection network means toggling said true input buffer portion so that the true data output node is returned to its initial logic state when the output terminal is free of the transient noise; and said protection network having its first input node connected to the collector master data output node, its second input node connected to the complementary data output node of said complementary output buffer portion and its output node connected to the second input node of said complementary output buffer portion.

6. A flip-flop as claimed in claim 5, wherein said protection network means comprises a first receiver having its one end defining the first data input node thereof and being connected to the collector master data output node, the other end of said first resistor being connected to the base of first transistor, said first transistor having its emitter connected to a ground potential and its collector connected to the emitter of a second transistor, said second transistor having its base connected to a supply potential via a second resistor and having its collector connected to the anode of a diode and to the base of a third transistor, the cathode of said diode defining the second data input node thereof and being connected to the complementary data output node of said complementary output buffer portion, said third transistor having its emitter connected to the base and collector of a fourth transistor, the emitter of said fourth transistor being connected to a ground potential, said third transistor having its collector defining the output node thereof and being connected to the supply potential via a third resistor and to the second data input node of said complementary output buffer portion.

7. A flip-flop as claimed in claim 6, wherein said diode is a Schottky-barrier diode.

8. A flip-flop as claimed in claim 6, wherein said first through fourth transistors are Schottky transistors.

* * * * *